United States Patent [19]

Sakakura et al.

[11] Patent Number: 5,773,976
[45] Date of Patent: Jun. 30, 1998

[54] SHIMMING IN MAGNETIC RESONANCE IMAGING

[75] Inventors: Yoshitomo Sakakura, Nishinasuno-Machi; Hiromi Kawamoto, Yaita; Masafumi Kondo, Sagamihara, all of Japan

[73] Assignee: Kabushiki Kaisha Toshiba, Kawasaki, Japan

[21] Appl. No.: 588,058

[22] Filed: Jan. 19, 1996

[30] Foreign Application Priority Data

Jan. 20, 1995 [JP] Japan ................................. 7-007267

[51] Int. Cl.⁶ .............................. G01R 33/20; A61B 5/00
[52] U.S. Cl. ............................................................ 324/318
[58] Field of Search ................. 29/600, 605; 128/653.5; 324/300, 307, 318, 322, 320

[56] References Cited

U.S. PATENT DOCUMENTS

| | | | |
|---|---|---|---|
| 3,735,306 | 5/1973 | Kabler et al. | 336/192 |
| 4,642,569 | 2/1987 | Hayes et al. | 324/318 |
| 4,737,716 | 4/1988 | Roemer et al. | |
| 4,987,371 | 1/1991 | Glover et al. | 324/320 |
| 5,111,147 | 5/1992 | Aubert | 324/318 |
| 5,168,232 | 12/1992 | Glover et al. | 324/320 |
| 5,289,129 | 2/1994 | Joseph | 324/318 |
| 5,304,933 | 4/1994 | Vavrek et al. | 324/318 |
| 5,349,297 | 9/1994 | DeMeester et al. | 324/318 |
| 5,371,465 | 12/1994 | Onodera et al. | 324/309 |
| 5,481,191 | 1/1996 | Rzedzian | 324/318 |

FOREIGN PATENT DOCUMENTS 4-468386 10/1990 Japan .

Primary Examiner—Sandra L. O'Shea
Assistant Examiner—Michael Eisenberg
Attorney, Agent, or Firm—Limbach & Limbach L.L.P.

[57] ABSTRACT

An MRI system is provided for improving the magnetic coupling and positional relationship between gradient coils and shim coils, thus simplifying positioning of the coils (retention of orthogonality), designing an MRI system compactly, and reducing cost. An MRI system comprises a magnet generating a static magnetic field and a gradient coil unit generating a gradient magnetic field superposed on the static magnetic field. The gradient coil unit is formed into a substantially cylindrical shape having an outer circumferential surface, and shields the gradient magnetic field from being leaked out into a radially outer space. The MRI system further comprises a shim coil unit generating a correcting magnetic field homogenizing the static magnetic field. The shim coil unit is mounted on the outer circumferential surface of the gradient coil unit in common serving as a bobbin for the shim coil unit.

20 Claims, 6 Drawing Sheets

SHIMMING IN MAGNETIC RESONANCE IMAGING

BACKGROUND OF THE INVENTION

1. Field of the Invention

The present invention relates to a magnetic resonance imaging (hereinafter MRI) system, or more particularly, to an MRI system having shield-type gradient coils, which produces magnetic field gradients to be superposed on a static magnetic field, and shim coils for homogenizing the static magnetic field.

2. Description of the Related Art

In MRI, as already known, a static magnetic field to be produced using a magnet such as a superconducting magnet is desired to have strict homogeneity. This is because the homogeneity of a static magnetic field is an important factor for determining the quality (signal-to-noise ratio and resolution) of a spectrum of an MR signal to be acquired. For homogenizing a static magnetic field, normally, shim coils are interposed between a magnet for producing a static magnetic field and gradient coils inside a magnetic field space of the magnet. A current to be fed to each of the shim coils is controlled manually or automatically by means of a computer. The number of channels of, for example, a shim coil for secondary shimming is five, including ,shimming channels $Z^2$, ZX, ZY, XY, and $X^2$-$Y^2$. The number of channels of a shim coil is determined by conditions such as a size of a required measurement area in an imaging space and a required precision in homogeneity. A gradient coil unit (having x, y, and z coils) is often used in common for primary shimming in X, Y, and Z channels.

There is a well-known example of a shim coil and manufacturing process. A coil pattern is created on a flexible printed-circuit board, and then the printed-circuit board is rolled up cylindrically. A thus-created shim coil is placed coaxially with a gradient coil unit inside a magnet for producing a static magnetic field while being separated by a given distance from the gradient coil unit.

However, the shim coil is magnetically coupled with gradient coils of the gradient coil unit. These shim and gradient coils must therefore be separated from each other by a given distance so that they can be handled as independent coils. This brings about various problems in the MRI system.

The first problem is that when the gradient and shim coils are placed mutually separately in production of an MRI system, it is hard to retain their orthogonality (that is, relative to their relative positions for making an orthogonal cross arrangement).

The second problem is that since the diameter of the shim coil must be made larger, the diameter of a bore of a magnet for producing a static magnetic field becomes relatively large. This poses a factor of preventing downsizing of the whole magnet of an MRI system.

Since the diameter becomes larger, the quantity of the material increases. This leads to an increase in manufacturing cost of a shim coil itself.

Moreover, since there is a magnetic coupling between the gradient and shim coils, when an attempt is made to exert the natural ability of a shim coil to homogenize a static magnetic field while canceling the coupling, a large-capacity power supply becomes necessary for the shim coil. This results in an increase in size of a shim coil power supply and a rise in its manufacturing cost.

SUMMARY OF THE INVENTION

The present invention attempts to solve the foregoing problems of the prior art. An object of the present invention is to provide an MRI system in which the magnetic coupling and positional relationship between gradient coils and shim coils can be reconsidered, positioning of the coils (retention of orthogonality) can be simplified, and a decrease in size and cost alike can be attained.

Another object is, in addition to the above, to decrease in size a shim coil power supply and its manufacturing cost.

In order to achieve the foregoing objects, as in one aspect of the present invention, there is provided a magnetic resonance imaging system comprising: a magnet generating a static magnetic field; a gradient coil unit generating a gradient magnetic field superposed on the static magnetic field, being formed into a substantially cylindrical shape having an outer circumferential surface, and for shielding the gradient magnetic field from leaking out into a radially outer space of the gradient coil unit; and a shim coil unit generating a correcting magnetic field homogenizing the static magnetic field and being mounted on the outer circumferential surface of the gradient coil unit in common serving as a bobbin for the shim coil unit.

Preferably, the gradient coil unit is an active shielded gradient coil unit using a plurality of gradient coil sets. Still preferably, the gradient coil unit is a passive shielded gradient coil unit using a passive shielding means for shielding the gradient magnetic field.

It is preferred that the shim coil unit comprises a plurality of channels of shim coils for higher-order shimming more than primary shimming. For example, the shim coil unit is a unit for secondary shimming.

Further, it is preferred that the shim coil unit comprises a plurality of channels of shim coils formed with a flexible printed-circuit board having a flat insulation base having two side surfaces back to back, a plurality of conductor patterns each corresponding to each of the plurality of shim coils being formed on either one of the two side surfaces and a jumper means connecting to at least one of the conductor patterns being formed on the other of the two side surfaces. For example, the jumper means includes at least one of a first electric line connecting the conductor patterns to each other and a second electric line connecting one of the conductor patterns to a power-supply lead member for the shim coil unit. Preferably, the jumper means is arranged in a manner such that an axial-directional component of the correcting magnetic field is diminished, the axial-directional component being caused by a current flow through the jumper means and being oriented in an axial direction of the magnet.

It is preferred that the shim coil unit includes at least one pair of the flexible printed-circuit boards layered in a manner that sides of the flexible printed-circuit boards on which the jumper means is formed respectively are faced to each other, the jumper means of each of the flexible printed-circuit boards being differentiated in arrangement-positionally from each other, thereby the insulation base of each of the flexible printed-circuit boards acting in common acts as an insulation means between the paired boards.

According to the present invention, as another aspect, there is a method of manufacturing a shim coil unit generating a correcting magnetic field and being interposed between a magnet generating a static magnetic field and a gradient coil unit generating a gradient magnetic field superposed on the static magnetic field, the correcting magnetic field homogenizing at least a three-dimensional imaging region in the static magnetic field, the method comprising the steps of: preparing the gradient coil unit formed into a substantially cylindrical shape and into a shield-type gradient coil unit shielding the gradient magnetic field from being leaked out into a radially outer space of the gradient coil unit; preparing the shim coil unit formed into a flexible flat member; and winding the shim coil unit around the gradient coil unit in common serving as a bobbin for the shim coil unit.

In the invention, gradient pulses hardly leak out. The magnetic coupling between gradient coil units and shim coil units is markedly lessened. The gradient coil unit and shim coil unit hardly affect each other and can be identified independently. The shim coil unit can therefore be mounted on the outer surface of the gradient coil unit as part thereof or united with the gradient coil unit on the outer surface thereof. The sizes in a radial direction of the shim coil unit and static field magnet can be reduced, and shimming magnetic fields are therefore requested to provide lower power. This results in a compact and small-capacity shimming power supply. Furthermore, the orthogonality between the gradient coils and shim coils can be retained easily in the course of manufacturing.

When each shim coil constituting the shim coil unit is laminated using a flexible printed-circuit board, if a base substrate of the printed-circuit board is used in common as an insulation layer between channels, or if sides of printed-circuit boards on which jumper members are formed are opposed and attached to each other, the thickness in a radial direction of the shim coil unit itself can be reduced markedly.

The shim coils can be placed more closely to an intended space relative to which a static magnetic field must be homogenized. Consequently, the shim coil unit, static field magnet, and ultimately the whole gantry can be made compact and lightweight.

The orientations (front and back sides) of flexible printed-circuit boards realizing the shim coils are devised advantageously, and the base substrates of the flexible printed-circuit boards are used as insulation layers, whereby the thickness in a radial direction of each shim coil can be made very small. This contributes to an ease of operation and a compact and lightweight design of a gantry of an MRI system.

DETAILED DESCRIPTION OF THE PREFERRED EMBODIMENTS

Embodiments of the present invention will be described in conjunction with FIGS. 1 to 7.

Figure 1:
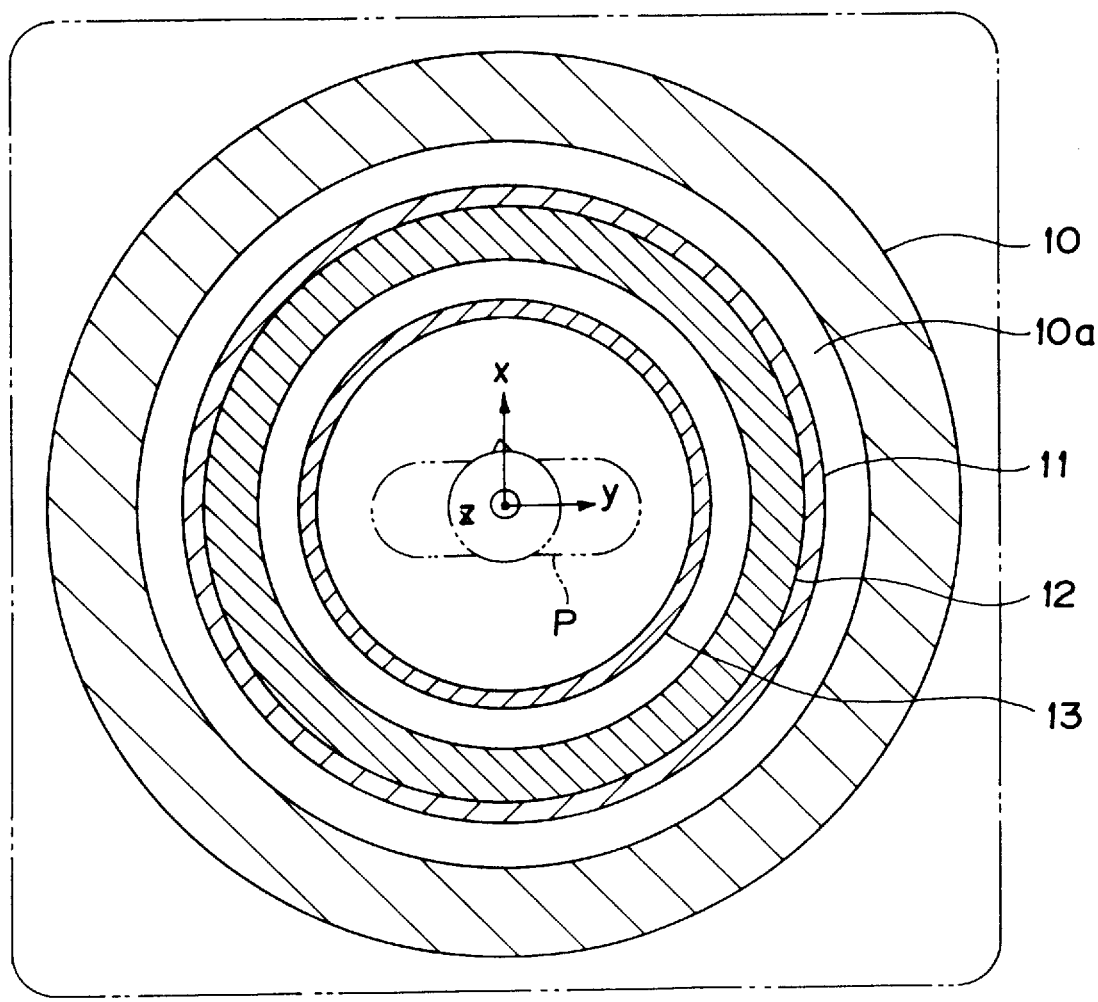
FIG. 1 is a conceptual diagram showing the locations of a magnet and coils in a state in which a gantry of an MRI system of an embodiment of the present invention is viewed in an axial direction thereof.

FIG. 1 shows a typical cross section in a state in which a gantry 1 of an MRI system of an embodiment is viewed in an axial (z-axis) direction of the gantry 1. The gantry 1 includes a cylindrical superconducting magnet 10 for producing a static magnetic field. In a bore 10a of the superconducting magnet 10 serving as a diagnostic space, a cylindrical shim coil unit 11 for homogenizing a static magnetic field induced in the bore 10a, and a cylindrical gradient coil unit 12 for producing magnetic field gradients to be used for acquiring spatial position information and to be superposed on the static magnetic field are situated coaxially. In a bore of the gradient coil unit 12, as shown in FIG. 1, for example, a whole-body RF coil 13 is mounted detachably. In a space inside the RF coil 13, a patient P lying down on a patient couch (not shown) is inserted for imaging. The shim coil unit 11 and gradient coil unit 12 achieve an embodiment of the concept of the present invention and are mutually united. In the gradient coil unit 12, x, y, and z coils, which can generate gradient pulses in x, y, and z directions respectively, are incorporated. These coils are connected independently to a field gradient power supply (not shown) and supplied a pulsating current dependent on a desired imaging pulse sequence. As described, for example, in U.S. Pat. Publication No. 4,737,716 (the title of the invention is "Self-shielded Gradient Coils for Nuclear Magnetic Resonance Imaging"), each of the x, y, and z coils consists of two coils. Thus, the x, y, and z coils constitute a gradient coil unit of a so-called "active shield type" having such a structure that gradient pulses of a desired strength are generated internally but a magnetic flux is hardly leaked out externally because magnetic fields are canceled out.

Figure 2:
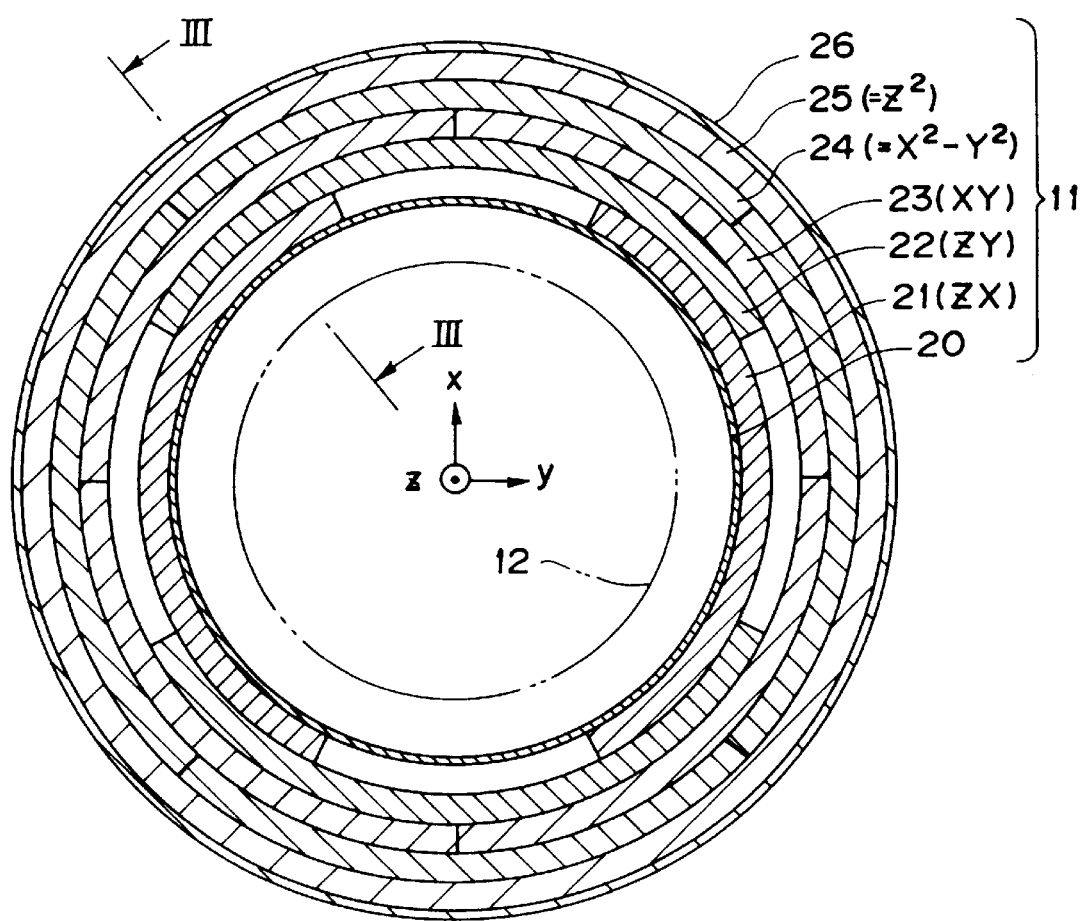
FIG. 2 is a layout of shim coils constituting a shim coil unit in a state in which the layered structure of the shim coil unit is viewed in an axial direction thereof.

On the outer circumferential surface of the gradient coil unit 12, the shim coil unit 11 is wound around the gradient coil unit 12 without any gap between them. The shim coil unit 11 has, as shown in FIG. 2, a secondary shimming structure composed of channels ZX, Zy, Xy, $X^2$-$Y^2$, and $Z^2$. To be more specific, the shim coil unit 11 comprises an inner resin layer 20 formed cylindrically, a channel-ZX shim coil 21 wound about the outer circumferential surface of the resin layer 20, a channel-ZY shim coil 22 wound about the outer circumferential surface of the shim coil 21, a channel-XY shim coil 23 wound about the outer circumferential surface of the shim coil 22, a channel-$X^2$-$Y^2$ shim coil 24 wound about the outer circumferential surface of the shim coil 23, a channel-$Z^2$ shim coil 25 wound about the outer circumferential surface of the shim coil 24, and a resin tape layer 26 wound about the outer circumferential surface of the last shim coil for the purpose of protection and insulation. The shim coils 21 to 25 of five channels are connected to a shimming power supply (not shown) and designed to perform secondary shimming manually or by means of a computer so that homogeneity of a desired precision level can be provided for a given three-dimensional area within a static magnetic field $H_0$ produced by the superconducting magnet 10.

Figure 3:
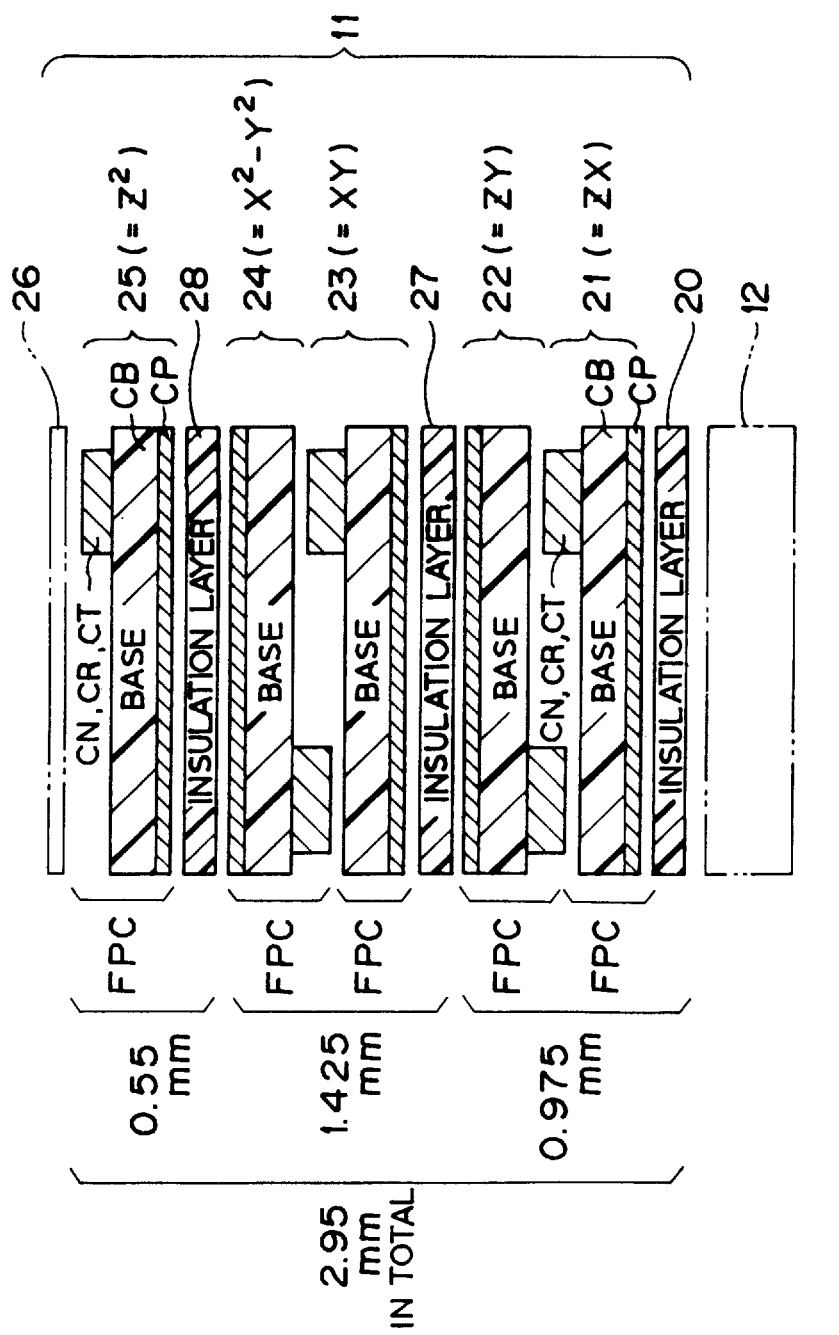
FIG. 3 shows schematically a III-III section of FIG. 2.

Each of the shim coils 21 to 25 of respective channels is, as shown in FIG. 3, realized with a single-sided flexible printed-circuit board (hereinafter FPC). Conductor patterns CP for a coil are formed on one side of an insulating base substrate B of the FPC. On the other side thereof, crossing jumpers CN for linking the conductor patterns CP, circulation jumpers CR for joining the conductor pattern groups, and/or return jumpers CT for joining the conductor patterns CP with a power lead are mounted.

Figure 4:
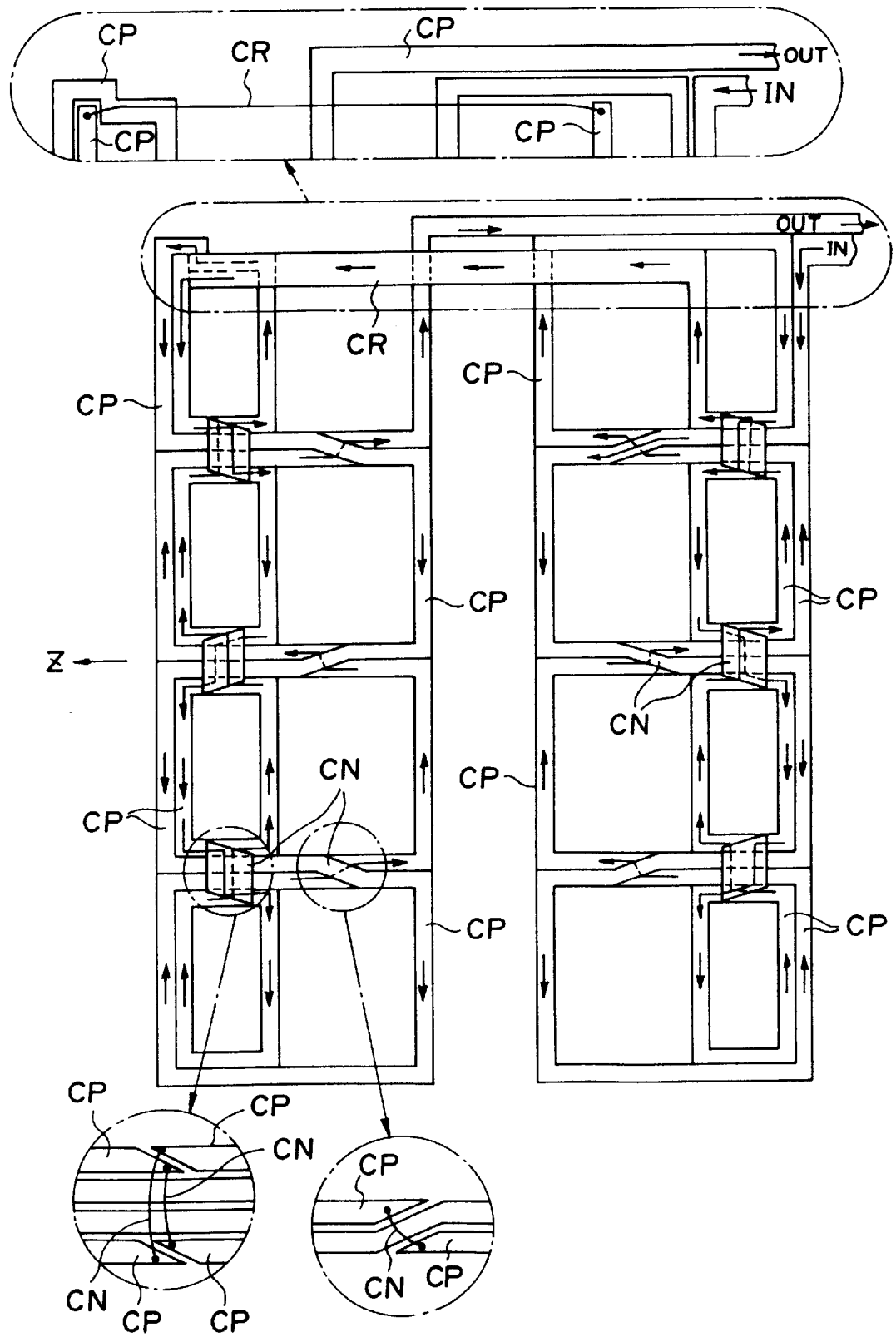
FIG. 4 is a typical development diagram showing a channel-XY shim coil.
Figure 5:
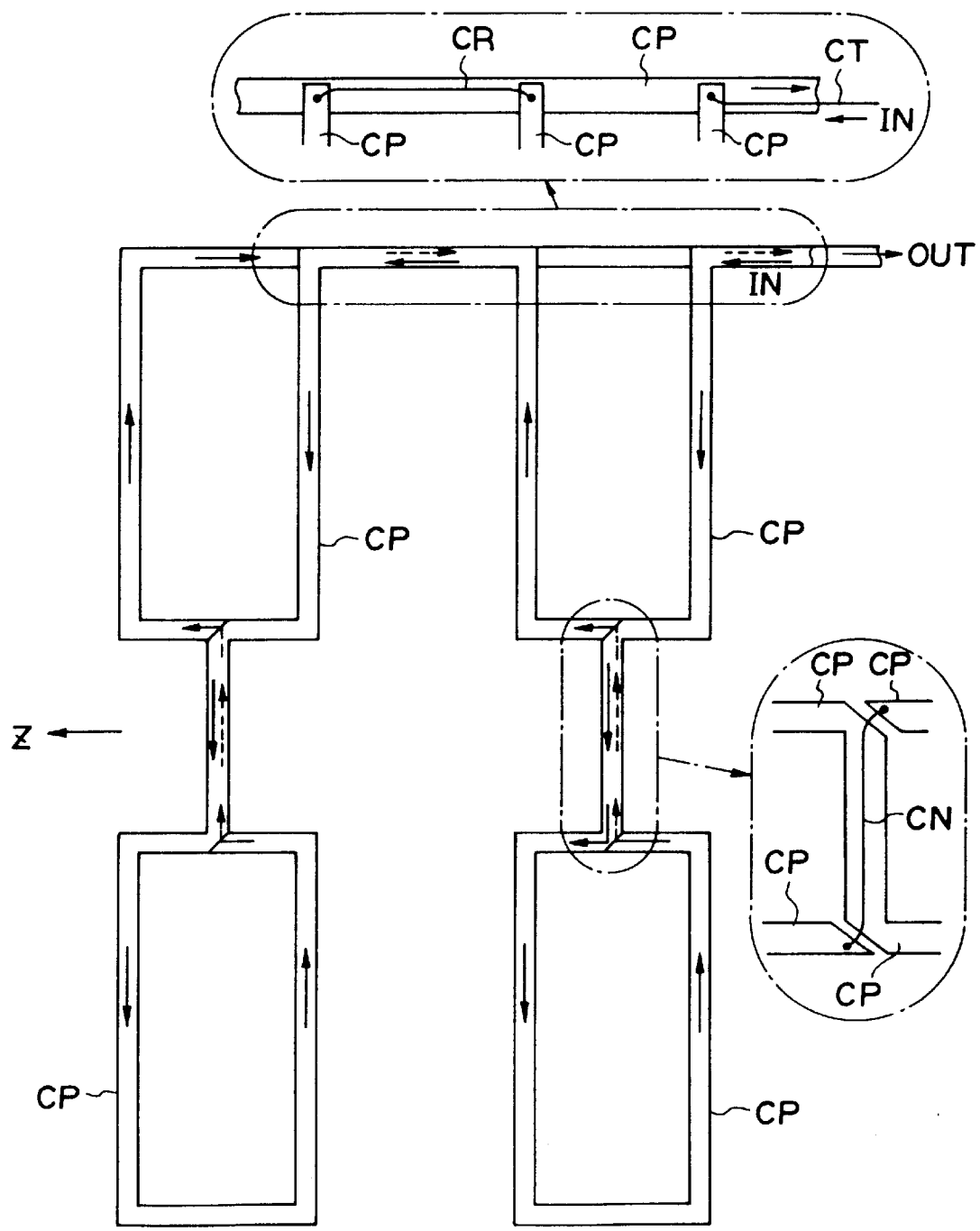
FIG. 5 is a typical development diagram showing a channel-ZX shim coil.

FIG. 4 shows examples of the conductor patterns CP, crossing jumpers CN, and circulation jumpers CR for channel XY, FIG. 5 shows examples thereof for channel ZX. In FIGS. 4 and 5, a flexible printed-circuit board is seen through from the front side (on which the crossing jumpers CN, circulation jumpers CR, and/or return jumpers CT are mounted) toward the back side and developed flatly. At a solid intersection linking conductor patterns CP, a dashed-line arrow indicates a direction of current flowing on the back side (that is, the conductor patterns CP), and a solid-line arrow indicates a direction of current flowing through a crossing jumper CN, circulation jumper CR, or return jumper CT on the front side. A current flowing through a simple conductor pattern that does not intersect another pattern is also indicated with a solid-line arrow.

The jumpers CN, CR and CT for each channel are positioned so that components in the Z-direction of unwanted magnetic fields induced by the jumpers CN, CR and CT will be canceled out so as not to affect shimming magnetic fields produced by the conductor patterns CP. In the shim coils 21 to 25 of respective channels, as long as current paths are linked in the form of a letter 8, the components in the Z-direction of unwanted magnetic fields produced by the circulation jumpers CR, crossing jumpers CN, and return jumpers CT can be canceled out.

The shim coils 21 to 25 of five channels having current paths created as mentioned above are, as shown in FIG. 3, multi-layered. In this case, FPCs are paired (in FIG. 3, FPCs 21 and 22 of channels ZX and ZY, and FPCs 23 and 24 of channels XY and $X^2$-$Y^2$). Each pair of FPCs 21 and 22 or FPCs 23 and 24 have their front sides opposed and attached to each other. The positions of the crossing jumpers CN, circulation jumpers CR, and return jumpers CT in a radial direction of the bore are different between each pair of opposed FPCs 21 and 22 and FPCs 23 and 24, and designed in advance in such a manner that the jumpers on one FPC will not positionally coincide with those on the mate FPC. Thus, since the front sides of FPCs on which the jumpers are mounted are attached to each other, only a space for one layer is needed substantially. The base substrate CB of each FPC serves as an insulation layer between channels. These lead to a decrease in size in a radial direction of a bore, and results in a very thin and compact shim coil unit.

Insulation layers 27 and 28 are interposed between the paired FPCs 21 and 22, and the paired FPCs 23 and 24, and between the pair of FPCs 23 and 24 and a remaining top-layer FPC 25. Since the channels are thus layered, the thickness of the shim coil unit 11 in the radial direction of the bore is about 3 mm in total (for example, 2.95 mm, wherein the thickness of the outer resin tape layer 26 is excluded). Thus, a thin shim coil unit is realized. In FIG. 3, the jumpers CN, CR and/or CT are typical ones, and a space is drawn between each pair of FPCs for better observation.

The thus-layered shim coil unit 11 is mounted on the outer surface of the gradient coil unit 12 of an active shield type, and united with the gradient coil unit 12 by vacuum pressure impregnation, taping, or the like.

As mentioned above, in this embodiment, the active shielded gradient coil (ASGC; also referred to as "Twin Shielded Gradient Coil" (TSGC)) unit 12 hardly leaks its own produced magnetic field to the outside. The magnetic coupling between the gradient coil unit 12 and shim coil unit 11 is smaller than that between a normal gradient coil unit (that is not of an active shield-type) and the shim coil unit 11. From this viewpoint, the shim coil unit 11 is formed on the outer surface of the gradient coil unit 12 as part thereof. The shim coils 21 to 25 can therefore be placed more closely to a diagnostic spatial area relative to which a static magnetic field must be homogenized than they can be conventionally. The strength of a shimming magnetic field produced by each of the shim coils 21 to 25 may be lower than the conventional one. The shim coils 21 to 25 themselves can therefore be designed thinly. The capacity of a shimming power supply can be reduced, and the expenses of materials and parts can be minimized. Moreover, the shimming power supply can be designed compactly. Furthermore, a space need not be created between the active shield-type gradient coil unit 12 and shim coil unit 11. The diameter of the bore of the superconducting magnet 10 can be diminished. This contributes to a decrease in size of the gantry 1. The downsizing makes it possible to diminish the installation space of the MRI system. Besides, there are many merits in terms of transportation, installation, or the like. Since the gradient coil unit 12 and shim coil unit 11 can be fixed to each other from the beginning, the orthogonality between the coils of the units 12 and 11 can be retained easily and effortlessly. Thus, since the magnetic field shimming ability to homogenize a static magnetic field improves, a highly homogeneous static magnetic field can be produced. This contributes to acquisition of stable high-quality MRI images. Furthermore, since the coil units 12 and 11 are united, the time required for assembly and installation can be shortened.

Figure 6:
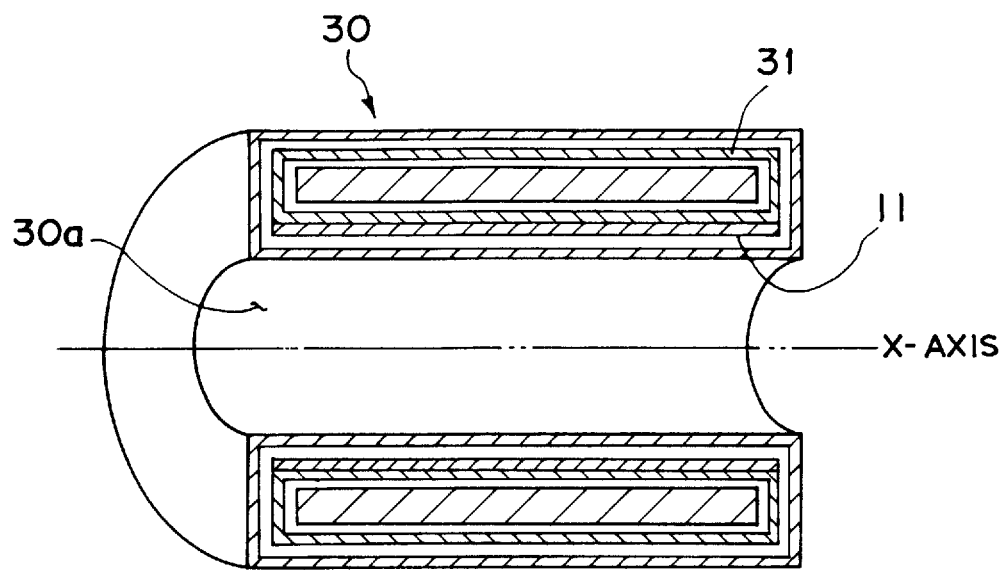
FIG. 6 is a schematic view showing a static field magnet, in which shim coils are incorporated, of an MRI system of another embodiment.

The aforesaid shim coil unit 11 is constructed using FPCs. The orientations of the FPCs of respective channels to be attached to one another are made different. The overall thickness of the shim coil unit 11 can therefore be made as thin as about 3 mm. Therefore, depending on the structure of a gantry or a magnet for producing a static magnetic field, the shim coil unit need not always be united with the gradient coil unit, but may be installed to a thermal radiation shield 31 facing a bore 30a of a static field magnet 30 (for example, a superconducting magnet) as shown in FIG. 6.

Figure 7:
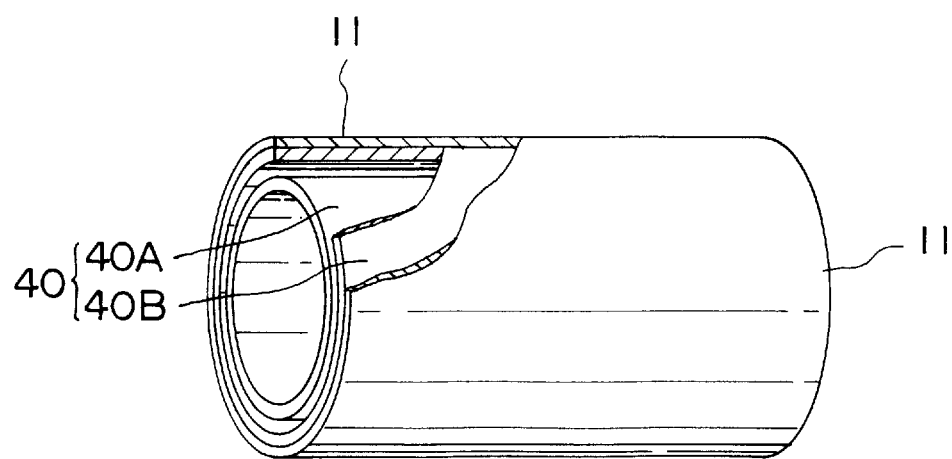
FIG. 7 is a schematic perspective view of another example of the present invention showing a passive shield type gradient coil unit.

A gradient coil unit according to the invention is not limited to the above shield-type, and a passive shield-type gradient coil unit may also be used in an MRI system in accordance with the invention. One example of a passive shield-type gradient coil unit is shown in FIG. 7, in which a reference 40 represents such a passive shield-type gradient coil unit 40 comprising a coil unit body 40A and a passive shielding member 40B placed around the coil unit body 40A.

A shim coil unit applicable to the invention is not limited to the above secondary shimming. A shim coil unit having a capability of performing higher-order shimming (more than secondary shimming) may also be employed in the invention. For example, the present invention is preferable to a shim coil unit for the third-order shimming having seven shimming channels.

The embodiments of the invention have been described as above, but it is understood that the invention is not limited to such embodiments and that the invention can be practiced in other various modified embodiments within the scope of the invention.

What is claimed is:

1. A magnetic resonance imaging system comprising:
   a magnet generating a static magnetic field;
   a gradient coil unit, formed into a substantially cylindrical shape having an outer circumferential surface, generating a gradient magnetic field superposed on the static magnetic field and shielding the gradient magnetic field from leaking out into a radially outer space of the gradient coil unit; and
   a shim coil unit, mounted on the outer circumferential surface of the gradient coil unit in common serving as a bobbin for the shim coil unit, comprising a plurality of channels of shim coils for generating a correcting magnetic field of higher-order shimming more than primary shimming by conducting electric current through the shim coils, said correcting magnetic field homogenizing the static magnetic field.

2. The system of claim 1, wherein the shim coil unit comprises a plurality of channels of shim coils having more than one order.

3. The system of claim 2 wherein the shim coil unit is a unit for secondary shimming and the plurality of channels of the shim coils comprise plural ones selected from five channels of ZX, ZY, XY, $X^2-Y^2$, and $Z^2$ when a direction of Z-channel coincides with an axial direction of the bobbin and both directions of X- and Y- channels are set to be perpendicular to the axial direction.

4. The system of claim 3, wherein the shim coil unit is arranged relative to the gradient coil unit without spatial gap.

5. The system of claim 3, wherein
each of the plurality of channels of the shim coils is formed by a flexible printed-circuit board being formed into a substantially cylindrical shape and having a flexible flat insulation base having two side surfaces back to back and a flexible conductor pattern corresponding to each of the plurality of shim coils and being formed on either one of the two side surfaces, wherein
at least one pair of the plurality of flexible printed-circuit boards are layered such that the remaining side surface are face to face.

6. The system of claim 5, wherein the flexible printed-circuit board further includes a jumper means being placed on the remaining side surface so as to connect one of mutually-crossed paths of the flexible conductor pattern formed on the one side surface.

7. The system of claim 6, wherein the at least one pair of flexible printed-circuit boards are layered in a manner that the jumper means of each of the flexible printed-circuit boards is differentiated in arrangement-positionally from each other, thereby the insulation base of each of the flexible printed-circuit boards acting in common as an insulation means between the paired boards.

8. The system of claim 1, wherein the shim coil unit comprises a plurality of channels of shim coils each formed by a flexible printed-circuit board having a flexible flat insulation base having two side surfaces back to back, a flexible conductor pattern corresponding to each of the plurality of shim coils and being formed on either one of the two side surfaces and a jumper means connecting one of mutually-crossed paths of the conductor pattern and being formed on other of the two side surfaces.

9. The system of claim 8, wherein the jumper means includes at least one of a first electric line connecting the path and a second electric line connecting the conductor pattern to a power-supply lead member for the shim coil unit.

10. The system of claim 9, wherein the plurality of flexible conductor patterns corresponding to the plurality of channels of shim coils include a conductor pattern that an axial-directional component of an unwanted magnetic field is diminished, the axial-directional component being caused by a current flow through the jumper means and being oriented in an axial direction of the magnet.

11. The system of claim 10, wherein the conductor pattern diminishing the axial-directional component is linked in the form of a letter 8.

12. The system of claim 8, wherein the shim coil unit includes at least one pair of the flexible printed-circuit boards layered in a manner that the other side surface of the base of each of the flexible printed-circuit boards are faced to each other, the jumper means of each of the flexible printed-circuit boards being differentiated in arrangement-positionally from each other, thereby the insulation base of each of the flexible printed-circuit boards acting in common as an insulation means between the paired boards.

13. A magnetic resonance imaging system according to claim 2, wherein the gradient coil unit is an active shielded-type gradient coil unit.

14. A magnetic resonance imaging system according to claim 2, wherein said shim coil unit comprises a plurality of channels of shim coils for generating a correcting magnetic field for third-order shimming.

15. A method of manufacturing a shim coil unit generating a correcting magnetic field and being interposed between a magnet generating a static magnetic field and a gradient coil unit generating a gradient magnetic field superposed on the static magnetic field, the correcting magnetic field homogenizing a three-dimensional imaging region in the static magnetic field, the method comprising the steps of:
preparing the gradient coil unit formed into a substantially cylindrical shape and into a shield-type gradient coil unit shielding the gradient magnetic field from leaking out into a radially outer space of the gradient coil unit;
preparing the shim coil unit being formed with a flexible flat member and comprising a plurality of channels of shim coils for generating the correcting magnetic field for higher-order shimming more than primary shimming by conducting electric current through the shim coils; and
winding the plurality of channels of shim coils around the gradient coil unit in common serving as a bobbin for the shim coil unit.

16. The method of claim 18, wherein the shim coil unit is a unit for secondary shimming and the plurality of channels of the shim coils comprise plural ones selected from five channels of ZX, ZY, XY, $X^2-Y^2$, and $Z^2$ when a direction of Z-channel coincides with an axial direction of the bobbin and both directions of X- and Y- channels are set to be perpendicular to the axial direction.

17. The method of claim 15, wherein the shim coil unit preparing step comprises the steps of:
preparing a flexible printed-circuit board having a flat insulation base having two side surface back to back;
forming a conductor pattern corresponding to each of the shim coils and being formed on either one of the two side surfaces and a jumper means connecting one of mutually-crossed paths of the conductor pattern and being formed on the other of the two side surfaces; and
layering at least one pair of the plurality of flexible printed circuit boards such that the remaining side surface are face to face.

18. The method of claim 15 wherein the preparing step includes the step of preparing the shim coil unit comprising a plurality of channels having more than one order.

19. The method of claim 18 wherein the gradient coil unit is an active shielded-type gradient coil unit.

20. The method of claim 18 wherein said preparing step includes the step of preparing the shim coil unit comprising a plurality of channels of shim coils for generating a correcting magnetic field for third-order shimming.

* * * * *